(12) United States Patent
Kim

(10) Patent No.: US 10,483,331 B2
(45) Date of Patent: Nov. 19, 2019

(54) COLOR FILTER ARRAY SUBSTRATE AND FABRICATING METHOD THEREOF AND ORGANIC LIGHT EMITTING DIODE DISPLAY DEVICE USING THE SAME

(71) Applicant: LG DISPLAY CO., LTD., Seoul (KR)

(72) Inventor: Chang Soo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/432,675

(22) Filed: Jun. 5, 2019

(65) Prior Publication Data

US 2019/0312089 A1 Oct. 10, 2019

Related U.S. Application Data

(62) Division of application No. 14/936,240, filed on Nov. 9, 2015, now Pat. No. 10,355,054.

(30) Foreign Application Priority Data

Nov. 11, 2014 (KR) .......................... 10-2014-0156322

(51) Int. Cl.
| | |
|---|---|
| H01L 27/32 | (2006.01) |
| H01L 51/52 | (2006.01) |
| G02B 5/20 | (2006.01) |
| H01L 51/00 | (2006.01) |
| H01L 29/08 | (2006.01) |
| H01L 35/24 | (2006.01) |

(52) U.S. Cl.
CPC .......... *H01L 27/322* (2013.01); *G02B 5/201* (2013.01); *H01L 51/5275* (2013.01); *H01L 51/5284* (2013.01)

(58) Field of Classification Search
USPC .......................................................... 257/40
See application file for complete search history.

(56) References Cited

U.S. PATENT DOCUMENTS

| | | |
|---|---|---|
| 2002/0005905 A1 | 1/2002 | Yamazaki et al. |
| 2003/0062520 A1 | 4/2003 | Toguchi et al. |

(Continued)

FOREIGN PATENT DOCUMENTS

| | | |
|---|---|---|
| CN | 1411325 A | 4/2003 |
| CN | 102636901 A | 8/2012 |
| JP | 54-103675 A | 8/1979 |

*Primary Examiner* — Nduka E Ojeh
(74) *Attorney, Agent, or Firm* — Birch, Stewart, Kolasch & Birch, LLP

(57) ABSTRACT

A method of fabricating an organic light emitting diode display device, includes forming a thin film transistor on a first substrate, forming an organic light emitting element electrically connected to the thin film transistor, on the first substrate, forming a black matrix, in which openings are formed, on one surface of a second substrate opposite to the first substrate, forming a color filter layer in the openings, forming a transparent insulation layer having a first surface and a second surface opposing the first surface on the second substrate, with the first surface of the transparent insulating layer in direct contact with the color filter layer, forming a plurality of optical patterns at the second surface of the transparent insulation layer, and attaching the first substrate and the second substrate such that the second surface of the transparent insulating layer is closer to the thin film transistor than the first substrate.

9 Claims, 5 Drawing Sheets

(56) References Cited

U.S. PATENT DOCUMENTS

| | | |
|---|---|---|
| 2004/0121602 A1 | 6/2004 | Maruyama et al. |
| 2004/0218123 A1 | 11/2004 | Park et al. |
| 2005/0196528 A1 | 9/2005 | Akiyoshi |
| 2008/0100781 A1* | 5/2008 | Choo ................ G02F 1/133536 349/96 |
| 2009/0135104 A1 | 5/2009 | Jeong |
| 2010/0079704 A1 | 4/2010 | Cho et al. |
| 2011/0128475 A1* | 6/2011 | Park ................ G02F 1/133514 349/96 |
| 2012/0140148 A1* | 6/2012 | Kadowaki ............ G02B 5/3058 349/64 |
| 2012/0206676 A1 | 8/2012 | Chung et al. |
| 2012/0326590 A1* | 12/2012 | Park ...................... G02B 27/26 313/112 |
| 2013/0101755 A1 | 4/2013 | Lee et al. |
| 2013/0222749 A1 | 8/2013 | Chiang et al. |
| 2014/0293187 A1* | 10/2014 | Nam ................... G02F 1/13362 349/62 |
| 2015/0346564 A1 | 12/2015 | Moriwaki et al. |

* cited by examiner

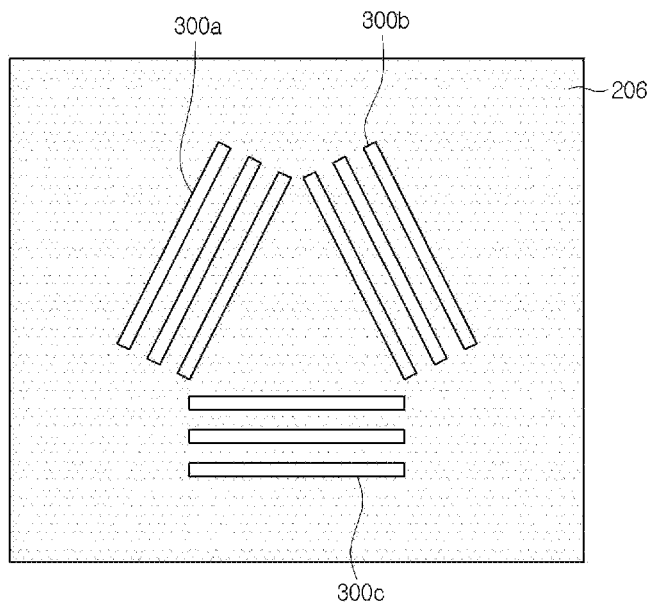

COLOR FILTER ARRAY SUBSTRATE AND FABRICATING METHOD THEREOF AND ORGANIC LIGHT EMITTING DIODE DISPLAY DEVICE USING THE SAME

CROSS-REFERENCE TO RELATED APPLICATIONS

This application is a Divisional of U.S. patent application Ser. No. 14/936,240, filed on Nov. 9, 2015, which claims the priority benefit of Korean Patent Application No. 10-2014-0156322, filed on Nov. 11, 2014, the contents of all these applications are hereby incorporated by reference in its entirety into this application.

BACKGROUND OF THE INVENTION

Field of the Invention

The present application relates to an organic light emitting diode display device and a fabricating method thereof. More particularly, the present application relates to an organic light emitting diode display device and a fabricating method thereof adapted to enhance an output efficiency of light in a perpendicular direction.

Description of the Related Art

Nowadays, a display field for visually representing an electrical information signal has been rapidly developed with the spread of information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, organic light emitting diode (OLED) display devices, electrophoretic display (electric paper display (EPD)) devices, plasma display panel (PDP) devices, field emission display (FED) devices, electroluminescence display (ELD) devices, elector-wetting display (EWD) devices, and so on can be introduced. Such flat panel display devices commonly include a flat display panel, which realizes an image, as a necessary component. The flat display panel is configured with a pair of combined substrates which face each other with having an inherent light emitting or polarizing material layer therebetween.

The OLED display device belonging to such flat panel display devices corresponds to a self-luminous device. Such an OLED display device does not require a separate light source which is used in the LCD device being a non-luminous device. As such, the OLED display device can become lighter and thinner. Also, the OLED display device has a wider viewing angle, a higher contrast ratio, lower power consumption and lower DC (direct current) voltage drive and a faster response speed, compared to the LCD device. Moreover, the OLED display device endures external impacts and is used in a wide temperature range because of having solidified internal components.

In the OLED display device, light emitted from an organic light emitting element must pass through a plurality of layers when being output to the exterior along a perpendicular direction. Then, a total reflection phenomenon is caused by reflectance differences between the plurality of layers. Due to this, light leaks in lateral directions. In view of this point, it is necessary to enhance an output efficiency of light in the perpendicular direction.

SUMMARY OF THE INVENTION

Accordingly, embodiments of the present application are directed to an OLED display device and a fabricating method thereof that substantially obviate one or more of problems due to the limitations and disadvantages of the related art.

The embodiments are to provide an OLED display device and a fabricating method thereof which are adapted to enhance an output efficiency of light by providing a transparent insulation layer with an optical pattern on a substrate having a color filter layer.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems and other limitations associated with the related art, an OLED display device according to an aspect of the present embodiments includes: a substrate; a black matrix, in which openings are formed, disposed on the substrate; a color filter layer disposed in the openings; and a transparent insulation layer disposed on the substrate, which is provided with the color filter layer, and configured to include optical patterns which are arranged in a shape of plural polygons. As such, the OLED display device can enhance an output efficiency of light.

A fabrication method of an organic light emitting diode display device according to another aspect of the present embodiments includes: disposing a thin film transistor on a first substrate; disposing an organic light emitting element, which is electrically connected to the thin film transistor, on the first substrate; disposing a black matrix, in which openings are formed, on one surface of a second substrate opposite to the first substrate; disposing a color filter layer in the openings; and disposing a transparent insulation layer with optical patterns on the second substrate provided with the color filter layer. The optical patterns are arranged in a shape of plural regular polygons.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIG. 3 is a planar view showing a mask according to the first embodiment of the present invention;

DETAILED DESCRIPTION OF THE INVENTION

Figure 1:
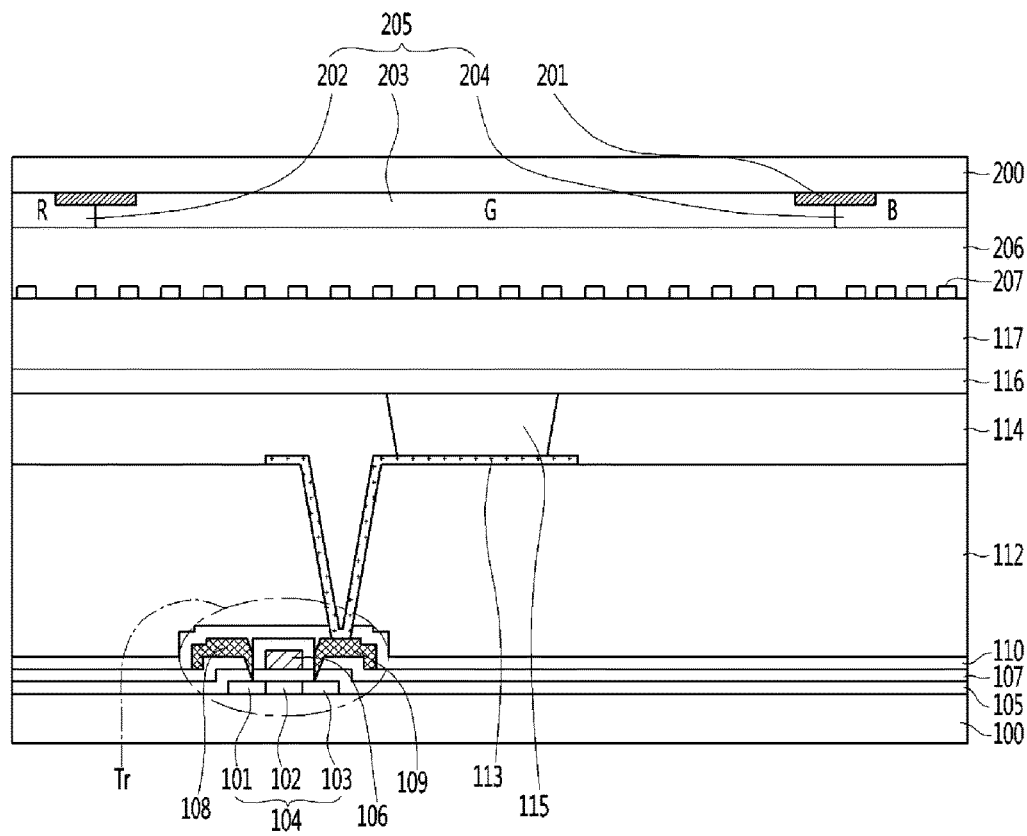
FIG. 1 is a cross-sectional view showing a color filter array substrate and an OLED display device including the same according to a first embodiment of the present invention.

Reference will now be made in detail to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing a color filter array substrate and an OLED display device including the same according to a first embodiment of the present disclosure. Referring to FIG. 1, the OLED display device according to the first embodiment of the present disclosure include a first substrate 100 loaded with a thin film transistor Tr, an organic light emitting element 113, 115 and 116, and a second substrate 200 which is disposed to face the first substrate 100 and include a color filter layer 205. Meanwhile, the color filter array substrate according to the first embodiment of the present disclosure includes the second substrate 200 coated with the color filter layer 205.

In detail, the thin film transistor Tr is disposed on the first substrate 100. Such a thin film transistor Tr includes a gate electrode 106, a semiconductor layer 104, a source electrode 108 and a drain electrode 109. The semiconductor layer 104 is disposed on the first substrate 100. Also, the semiconductor layer 104 includes a source domain 101, a channel domain 102 and a drain domain 103.

A gate insulation film 105 is disposed on the first substrate 100 provided with the semiconductor layer 104. The gate electrode 106 is disposed on the gate insulation film 105. Also, the gate electrode 106 can be formed from one of copper Cu, silver Ag, aluminum Al, chromium Cr, titanium Ti, tantalum Ta, molybdenum Mo and alloys thereof.

Although the gate electrode 106 is formed in a single metal layer, it is formed by stacking at least two metal layers as needed.

An interlayer insulation film 107 is disposed on the entire surface of the first substrate 100 provided with the gate electrode 106. Contact holes exposing the source domain 101 and the drain domain 103 are formed in the interlayer insulation film 107 and the gate insulation film 106. The source electrode 108 and the drain electrode 109 separated from each other are disposed on regions of an upper surface of the interlayer insulation film 107. In this case, the source electrode 108 and the drain electrode 109 are connected to the source and drain domains 101 and 103 of the semiconductor layer 104 through the contact holes which each penetrate through the interlayer insulation film 107 and the gate insulation film 105.

Such source and drain electrodes 109 can be formed from one of copper Cu, silver Ag, aluminum Al, chromium Cr, titanium Ti, tantalum Ta, molybdenum Mo and alloys thereof. Although the source and drain electrodes 108 and 109 are formed in a single metal layer, they can be formed by stacking at least two metal layers as needed. In this manner, the thin film transistor Tr is formed on the first substrate 100.

A protective film 110 used to protect the source electrode 108 and the drain electrode 109 is disposed on the entire surface of the first substrate 100 provided with the source electrode 108 and the drain electrode 109. A planarization film planarizing the surface of the first substrate 100 is disposed on the protective film 112.

A contact hole exposing the drain electrode 109 of the thin film transistor Tr is formed in the protective film 110 and the planarization film 112. Also, a first electrode 113 of an organic light emitting element is disposed on the planarization film 112 in such manner as to be connected to the drain electrode through the contact hole.

Such a first electrode 113 can be used as an anode electrode. To this end, the first electrode 113 can be formed in a single layer which is formed from a transparent conductive material with a relatively high work function value. Alternatively, the first electrode 113 can further include a reflective layer disposed under the transparent conductive layer.

Alternatively, the first electrode 113 can be formed in a multi-layered structure without limiting to the shape shown in the drawing. For example, the first electrode 113 can formed in a triple-layered structure which includes a first layer, a second layer formed on the first layer and a third layer formed on the second layer.

The first layer and the third layer can be formed from a transparent conductive material. For example, the transparent conductive material can become one of indium-tin-oxide ITO and indium-zinc-oxide IZO. The second layer can become a reflective layer. In this case, the second layer can be formed from one of a metal and a metal alloy. For example, the second layer can become one of a silver (Ag) layer and a metal alloy layer including silver Ag. As such, the organic light emitting element enables the first electrode 113 to reflect light emitted from the second electrode 116. In accordance therewith, a top emission type OLED display device can be realized.

A bank pattern 114 can be disposed on the planarization film 112 where the first electrode 113 is formed. The bank pattern 114 can be formed in a shape exposing a part of an upper surface of the first electrode 113.

An organic emission layer 115 can be disposed on the exposed first electrode 113. The organic emission layer 115 can be configured with a single layer which is formed from a light emission material. In order to enhance a light emission efficiency, the organic emission layer 115 can be configured with a plurality of layers which includes a hole injection layer HIL, a hole transport layer HTL, an emission material layer EML, an electron transport layer ETL and an electron injection layer EIL.

The second electrode 116 can be disposed on the entire surface of the first substrate 100 provided with the organic emission layer 115 and the bank pattern 114, in such a manner as to face the second first electrode. Such a second electrode 116 can be used as a cathode electrode.

The first substrate 100 with the above-mentioned structure can be provided as a thin film transistor array substrate.

The second substrate 200 can be disposed in such a manner as to face the first substrate 100 provided with the organic light emitting element 113, 115 and 116. A black matrix 201 can be disposed on one surface of the second substrate 200 which faces the first substrate 100. The black matrix 201 can form a plurality of openings.

The color filter layer 205 is disposed in the openings. Also, the color filter layer 205 can be disposed in such a manner as to partially overlap with an upper surface of the black matrix 201. Such a color filter layer 205 can include a red color filter pattern 202, a green color filter pattern 203 and a blue color filter pattern 204.

A transparent insulation layer 206 is disposed on the entire surface of the second substrate 200 provided with the color filter layer 205. The transparent insulation layer 206 can become one of an overcoat layer and a planarization film. As such, the second substrate 200 can have a planarized surface.

In such an OLED display device, light emitted from the organic light emitting element must pass through a plurality of layers when being output to the exterior along a perpendicular direction. Then, a total reflection phenomenon is caused by reflectance differences between the plurality of layers. Due to this, light must leak in lateral directions.

To address this matter, the OLED display device according to the first embodiment of the present disclosure includes the transparent insulation layer 206 with a refractive index of above 1.5. In this case, the second electrode 116 of the first substrate 100 disposed under the transparent insulation layer 206 has a refractive index of above 2.0 and the color filter layer 205 disposed on the transparent insulation layer 205 has a reflective index of about 1.45~1.50. In other words, the refractive index of the transparent insulation layer 206 is set to be a value between the refractive index of the second electrode 116 of the first substrate 100 and the refractive index of the color filter layer 205. As such, the light output efficiency of the OLED display device can be enhanced.

In order to prevent the light leakage in the lateral directions and enhance the light output efficiency in the perpendicular direction, the OLED display device according to the first embodiment of the present disclosure allows the transparent insulation layer 206 with optical patterns 207 to be disposed on the color filter layer 205. The optical pattern 207 can become one of concave and protrusive shapes.

The transparent insulation layer 206 can be formed from a transparent photoreactive material. The transparent photoreactive material can become one of a transparent positively-photoreactive material and a transparent negatively-photoreactive material.

If the transparent insulation layer 206 is formed from the transparent positively-photoreactive material, the optical pattern 207 can have the concave shape. On the contrary, when the transparent insulation layer 206 is formed from the transparent negatively-photoreactive material, the optical pattern 207 can have the protrusive shape. The optical pattern 207 with one of the concave and protrusive shapes changes a path (or course) of light progressing toward a lateral direction and allow path-changed light to be output in a perpendicular (or vertical) direction.

Such a transparent insulation layer 206 includes a plurality of optical patterns 207. The plurality of optical patterns 207 is arranged in a shape forming a plurality of regular trigons or regular tetragons. In other words, the optical patterns 207 formed on the transparent insulation layer 206 are arranged in a periodic lattice shape. In accordance therewith, the output efficiency of light passing through the transparent insulation layer 205 can be enhanced throughout the transparent insulation layer 206.

The optical patterns 207 are arranged in such a manner as to overlap with the color filter layer 205. In detail, the optical patterns 207 are arranged in an overlapping manner with the red, green and blue color filter patterns 202, 203 and 204. Also, the optical patterns 207 overlapping with the red color filter pattern 202, the optical patterns 207 overlapping with the green color filter pattern 203 and the optical patterns 207 overlapping with the blue color filter pattern 204 are arranged in different intervals (or distances) from one another.

In other words, the interval (or distance) between the optical patterns 207 can be varied along regions overlapping with the color filter patterns. As such, light output efficiencies for red, green and blue pixels emitting lights of different wavelengths can be effectively enhanced.

More specifically, the optical patterns 207 overlapping with the red color filter pattern 202 can be arranged in an interval of about 270 nm~450 nm. The optical patterns 207 overlapping with the green color filter pattern 203 can be arranged in another interval of about 240 nm~270 nm. The optical patterns 207 overlapping with the blue color filter pattern 204 can be arranged in still another interval of about 220 nm~240 nm.

In other words, the interval (or distance) between the optical patterns 207 adjacent to one another has the greatest length in the region overlapping with the red color filter pattern 202. On the contrary, the interval (or distance) between the optical patterns 207 has the smallest length in the region overlapping with the blue color filter pattern 204.

Also, the arrangement of the optical patterns 207 is not limited to the above-mentioned manner. Alternatively, the optical patterns 207 can be arranged only in the region overlapping with the organic emission layer 115.

In this manner, the color filter array substrate, which corresponds to the second substrate 200 of the OLED display device, according to the first embodiment of the present disclosure can be prepared. The first substrate 100 and the second substrate 200 can be combined with each other. To this end, a sealant layer 117 can be interposed between the first substrate 100 and the second substrate 200.

The color filter array substrate and the OLED display device with the same allow the transparent insulation layer 207 with the optical patterns, which are arranged in a shape of plural regular polygons, to be disposed on the color filter layer 205 of the second substrate 200. In accordance therewith, the light leak in the lateral directions can be prevented and the light output efficiency in the perpendicular direction can be enhanced. Moreover, the transparent insulation layer 206 with the plurality of optical patterns 207 is used as one of an overcoat layer and a planarization film. As such, it is not necessary to add any additional component for enhancing the light output efficiency.

Figure 2:
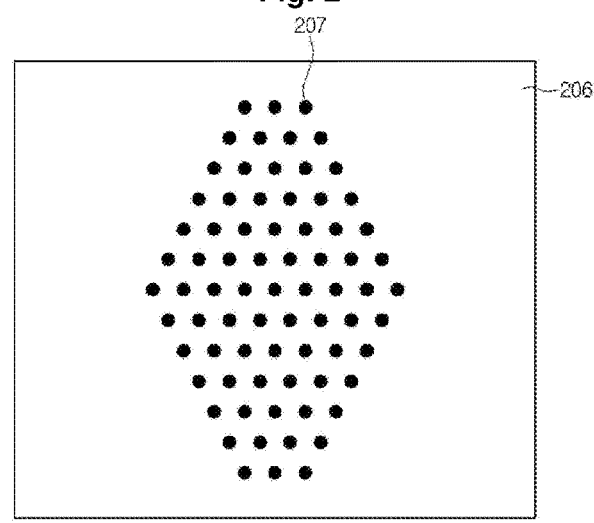
FIG. 2 is a planar view showing a transparent insulation layer with optical patterns according to the first embodiment of the present invention.

Secondly, the transparent insulation layer according to the first embodiment of the present disclosure will be described in detail with reference to FIG. 2. FIG. 2 is a planar view showing a transparent insulation layer with optical patterns according to the first embodiment of the present disclosure.

Referring to FIG. 2, a plurality of optical patterns 207 are arranged on a transparent insulation layer 206. The transparent insulation layer can be formed from a transparent photoreactive material. The transparent photoreactive material can be one of a transparent positively-photoreactive material and a transparent negatively-photoreactive material.

If the transparent insulation layer 206 is formed from the transparent positively-photoreactive material, the optical pattern 207 can have the concave shape. On the contrary, when the transparent insulation layer 206 is formed from the transparent negatively-photoreactive material, the optical pattern 207 can have the protrusive shape. The optical patterns 207 can be arranged in a shape of plural regular trigons.

The optical patterns 207 are arranged in the transparent insulation layer 206 overlapping with red, green and blue color filter patterns. The interval (or distance) between the optical patterns 207 within a region overlapping with the red color filter pattern is longer than that between the optical patterns 207 within the other regions overlapping with the green and blue color filter patterns. Also, the interval (or distance) between the optical patterns 207 within a region overlapping with the blue color filter pattern is shorter than that of the optical patterns 207 within the other regions overlapping with the red and green color filter patterns.

In detail, the optical patterns 207 overlapping with the red color filter pattern can be arranged in an interval of about 270 nm~450 nm. If the interval (or distance) between the optical patterns 207 arranged in the overlapping manner with the red color filter pattern is less than 270 nm, interference can be caused by light of ultraviolet wavelength. Also, the light output efficiency can deteriorate when the interval (distance) between the optical patterns 207 arranged in the overlapping manner with the red color filter pattern is more than 450 nm.

The optical patterns 207 overlapping with the green color filter pattern 203 can be arranged in another interval of about 240 nm~270 nm. If the interval (or distance) between the optical patterns 207 arranged in the overlapping manner with the green color filter pattern is less than 240 nm, interference can be caused by light of ultraviolet wavelength. Also, the light output efficiency can deteriorate when the interval (distance) between the optical patterns 207 arranged in the overlapping manner with the green color filter pattern is more than 270 nm.

The optical patterns 207 overlapping with the blue color filter pattern 204 can be arranged in still another interval of about 220 nm~240 nm. If the interval (or distance) between the optical patterns 207 arranged in the overlapping manner with the blue color filter pattern is less than 220 nm, interference can be caused by light of ultraviolet wavelength. Also, the light output efficiency can deteriorate when the interval (distance) between the optical patterns 207 arranged in the overlapping manner with the green color filter pattern is more than 240 nm.

The transparent insulation layer 206 according to the first embodiment of the present disclosure includes the optical patterns 207 which are arranged in the different intervals (or distance) from one another on the basis of overlapping with any one of the red, green and blue color filter patterns. In other words, the interval (or distance) between the optical patterns 207 adjacent to one another is varied along with the red, green and blue color filter patterns. In accordance therewith, the light output in the perpendicular direction can be easily performed within all sub-pixels. Also, the transparent insulation layer 206 is formed from the photoreactive material. As such, the optical patterns 207 can be formed without an additional etching process.

Thirdly, a mask according to a first embodiment of the present disclosure which is used to form the optical patterns of the transparent insulation layer will be described in detail with reference to FIG. 3. FIG. 3 is a planar view showing a mask according to the first embodiment of the present disclosure.

Referring to FIG. 3, the mask 300 used to form optical patterns on the transparent insulation layer includes a plurality of slits. In detail, the mask 300 includes a plurality of first slits 300a each extending in a first direction, a plurality of second slits 300b each extending in a second direction, and a plurality of third slits 300c each extending in a third direction.

The plurality of first slits 300a is arranged parallel to one another in a perpendicular direction to the first direction. The plurality of second slits 300b is arranged parallel to one another in a perpendicular direction to the second direction. The plurality of third slits 300c is arranged parallel to one another in a perpendicular direction to the third direction. The first slits 300a, the second slits 300b and the third slits 300c can be arranged in a shape of regular trigon lattices.

The first slits 300a, the second slits 300b and the third slits 300c are arranged in the shape of regular trigon lattices. As such, it can be generated a periodic light interference effect. In accordance therewith, the optical patterns can be formed on the transparent insulation layer in such a manner that they are arranged in a shape forming plural regular trigons.

The mask 300 according to the first embodiment of the present disclosure, which is used to form the optical patterns on the transparent insulation layer, allows the first slits 300a, the second slits 300b and the third slits 300c to be arranged in the shape of the regular trigon lattices. As such, the periodic light interference effect can be generated.

Figure 4A:
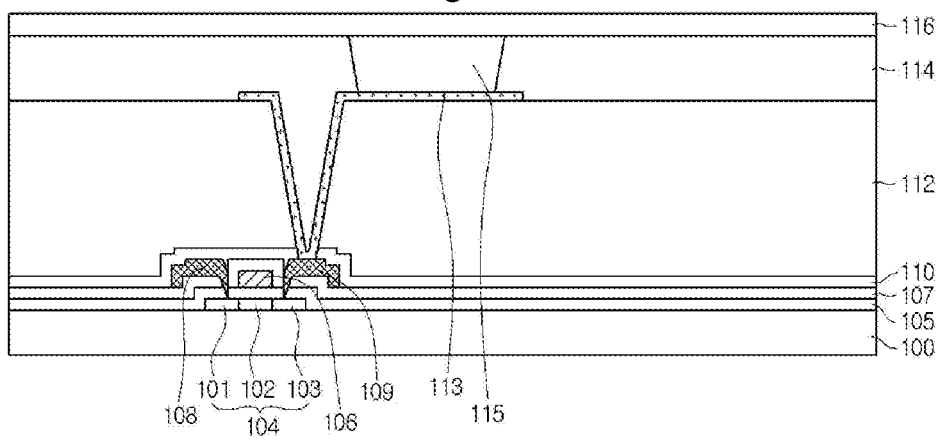
FIGS. 4A through 4C are views illustrating a method of fabricating an OLED display device according to the first embodiment of the present invention.
Figure 4B:
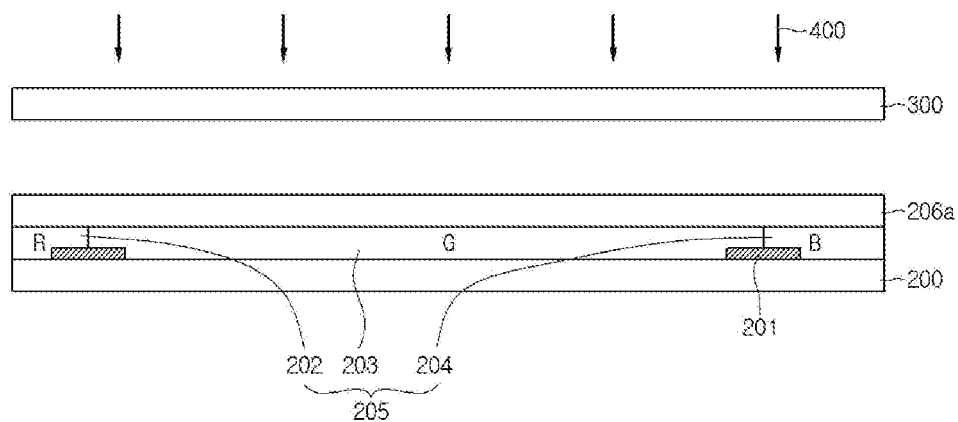
Figure 4C:
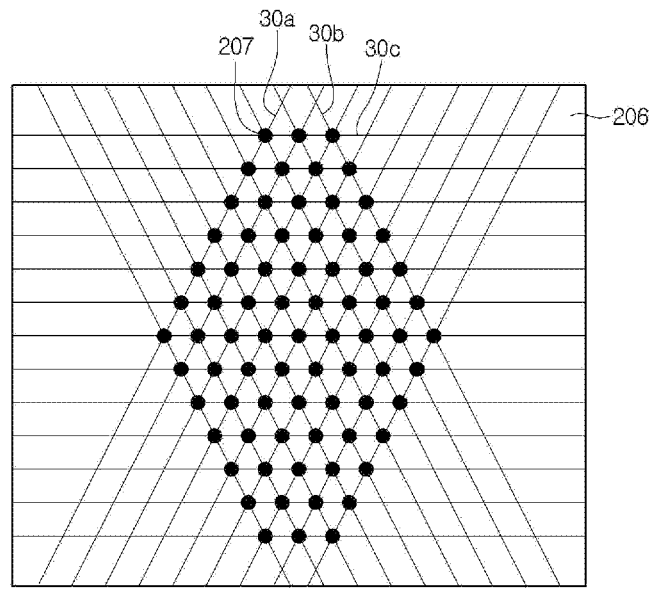

Continuously, a fabrication method of the OLED display device according to the first embodiment of the present disclosure will be described in detail with reference to FIGS. 4A through 4C. FIGS. 4A through 4C are views illustrating a method of fabricating an OLED display device according to the first embodiment of the present disclosure.

Referring to FIG. 4A, a semiconductor material layer such as an amorphous silicon film is formed on a first substrate 100. The semiconductor material layer is partially etched using a photoresist process. In accordance therewith, a semiconductor layer 104 is formed.

Then, a gate insulation film 105 is formed on the entire surface of the first substrate 100 provided with the semiconductor layer 104. In order to form a gate electrode 106 on the gate insulation 105, a gate metal layer is formed on the entire surface of the first substrate 100 (i.e., the gate insulation film 105). The gate metal layer is partially etched using a photoresist process, thereby forming the gate electrode 106.

The gate metal layer can be formed from a variety of metal materials. For example, the gate metal layer can be formed from one of copper Cu, silver Ag, aluminum Al, chromium Cr, titanium Ti, tantalum Ta and alloys thereof. Although it is shown in the drawing that the gate electrode 106 is formed in a single metal layer, the gate electrode 106 can be formed by stacking at least two metal layers as needed.

A source domain 101 and a drain domain 103 are formed in the semiconductor layer 104 by doping dopant ions into the semiconductor layer 104 at a high concentration using the gate electrode 106 as a mask. A numeral of '102,' which is inserted in the drawing but not explained, indicates a channel domain.

Thereafter, an interlayer insulation film 107 is formed on the entire surface of the first substrate 100 provided with the gate electrode 106. The interlayer insulation film 107 and the gate insulation film 106 are sequentially and partially etched using a photoresist process. In accordance therewith, contact holes exposing the source and drain domains 101 and 103 of the semiconductor layer 104 are formed.

A source/drain electrode material layer is formed on the entire surface of the first substrate 100 provided with the contact holes, i.e., on the interlayer insulation film 107 provided with the contact holes. The source/drain electrode material layer is partially etched using a photoresist process. Therefore, a source electrode 108 and a drain electrode 109 are formed.

The source/drain electrode material layer can be formed from a variety of metal materials. For example, the source/drain electrode material layer can be formed from one of copper Cu, silver Ag, aluminum Al, chromium Cr, titanium Ti, tantalum Ta and alloys thereof. Although it is shown in the drawing that the source and drain electrodes 108 and 109 are formed in a single metal layer, the source and drain electrodes 108 and 109 can be formed by stacking at least two metal layers as needed. In this way, a thin film transistor Tr is formed on the first substrate 100.

A protective film 110 is formed on the entire surface of the first substrate 100 provided with the thin film transistor Tr. Also, a planarization film 112 is formed on the protective film 110. In order to form a contact hole exposing the drain electrode 109, the planarization film 112 is partially etched using a photoresist process. Subsequently, the protective film 110 is partially etched using the partially etched planarization film as a mask. As such, the contact hole exposing the drain electrode 109 is formed in the planarization film 112 and the protective film 110.

A first electrode material layer is formed on the entire surface of the first substrate 100 provided with the contact hole, that is on the planarization film 112 provided with the contact hole. The first electrode material layer is partially etched using a photoresist process, thereby forming a first electrode 113. Such a first electrode 113 can be formed from one of indium-tin-oxide ITO and indium-zinc-oxide IZO.

Although it is shown in the drawing that the first electrode 113 is formed in a single layer, the first electrode 113 can be formed in a multi-layered structure as needed. For example, the first electrode 113 can be formed in a triple-layer structure which includes a first layer, a second layer formed on the first electrode and a third electrode formed on the second electrode.

In this case, the first layer and the third layer can be formed from a transparent conductive material. For example, the transparent conductive material can be one of indium-tin-oxide ITO and indium-zinc-oxide IZO. Meanwhile, the second layer can be a reflective layer. As such, the second layer can be formed from one of a metal and a metal alloy. For example, the second layer can be formed from one of silver Ag and a metal alloy including silver Ag.

Continuously, a bank pattern 114 with an opening exposing the first electrode 113 is formed on the first substrate 100 provided with the first electrode 113. Also, an organic emission layer 115 is formed on the first electrode 113 exposed by the opening which is formed in the bank pattern 114.

In order to enhance the light emission efficiency, the organic emission layer 115 can be formed in a multi-layered structure which includes a hole injection layer HIL, a hole transport layer HTL, an emission material layer EML, an electron transport layer ETL and an electron injection layer EIL. As shown in the drawing, the organic emission layer 115 can be configured with a single layer which is formed from a light emission material. However, the present disclosure is not limited to this.

A second electrode 116 can be disposed on the entire surface of the first substrate 100 provided with the organic emission layer 115. The second electrode 116 can be a metal material. In this way, the thin film transistor Tr and an organic light emitting element 113, 115 and 116 can be formed on the first substrate 100.

Referring to FIGS. 4B and 4C, a black resin layer is formed on a second substrate 200. Also, a photoresist is coated on the black resin layer. An exposure process using a mask with transmission and interception portions and a development process are performed for the coated photoresist. As such, the coated photoresist is patterned into a photoresist pattern. The black resin layer is etched using the photoresist pattern as an etch mask, thereby forming a black matrix 201.

The black matrix 201 has a lattice shape. As such, a plurality of openings can be formed in the black matrix 201. In other words, the openings formed in the black matrix 201 can expose formation regions of red, green and blue color filter patterns 202, 203 and 204.

A red resin layer is formed on the second substrate 200 provided with the black matrix 201. The red resin layer is patterned through a photolithography procedure. In accordance therewith, the red color filter pattern 202 is formed.

Also, a green resin layer is formed on the second substrate 200 provided with the red color filter pattern 202. The green resin layer is patterned through another photolithography procedure. In accordance therewith, the green color filter pattern 203 is formed.

Moreover, a blue resin layer is formed on the second substrate 200 provided with the green color filter pattern 203. The blue resin layer is patterned through still another photolithography procedure. In accordance therewith, the blue color filter pattern 204 is formed.

The red, green and blue color filter patterns 202, 203 and 204 can be disposed in the openings of the black matrix 201. Also, the red, green and blue color filter patterns 202, 203 and 204 can partially overlap with an upper surface of the black matrix 201.

Subsequently, a transparent insulation material layer 206a for a transparent insulation layer is formed on the entire surface of the second substrate 200 provided with the red, green and blue color filter patterns 202, 203 and 204. The transparent insulation material layer 206a can be formed from a transparent photoreactive material.

A mask 300 is disposed in such a manner as to face the second substrate 200 provided with the transparent insulation material layer 206a. The mask 300 includes a plurality of slits. In detail, the mask 300 includes a plurality of first slits each extending along a first direction 30a, a plurality of second slits each extending along a second direction 30b and a plurality of third slits each extending a third direction 30c.

The plurality of first slits can be arranged parallel to one another in a perpendicular direction to the first direction 30a.

Also, the plurality of second slits can be arranged parallel to one another in a perpendicular direction to the second direction 30b. Similarly, the plurality of third slits can be arranged parallel to one another in a perpendicular direction to the third direction 30c. Moreover, the first slits, the second slits and the third slits can be arranged in a shape of regular trigon lattices.

Thereafter, light 400 is irradiated onto the transparent insulation material layer 206a through the mask 300 having the plurality of slits. In accordance therewith, the transparent insulation layer 206 with a plurality of optical patterns 207 is formed.

The optical patterns 207 can be arranged in a shape of plural regular trigons because the slits of the mask 300 are arranged in the shape of regular trigon lattices. Each of the optical patterns 207 can be formed at a position of the transparent insulation material layer 206a opposite to an intersection of the first, second and third slits. This results from the fact that lights 400 passing through the first, second and third slits and being united into one reinforcement-interfere with one another on the transparent insulation material layer 206a. Meanwhile, any optical pattern cannot be formed in the other regions of the transparent insulation material layer 206a not opposite the intersection of the first, second and third slits because lights passing through the first, second and third slits offset-interference with one another.

Also, the optical pattern 207 can become one of a concave and a protrusion. If the transparent insulation material layer 206a is formed from a transparent positively-photoreactive material, the optical pattern 207 can be formed in a concave shape. On the contrary, when the transparent insulation material layer 206a is formed from a transparent negatively-photoreactive material, the optical pattern 207 can be formed in a protrusion shape.

In the above-mentioned way, the second substrate 200 used as a color filter array substrate is prepared. Also, an OLED display device can be fabricated by combining the first substrate 100 and the second substrate 200.

Such a fabrication method of the OLED display device according to the first embodiment of the present disclosure uses the mask 300 with the plurality of slits which are arranged in the shape of regular trigon lattices. As such, the optical patterns 207 arranged in the shape of plural regular trigons can be formed on the transparent insulation layer 206 without an additional etch process.

Figure 5:
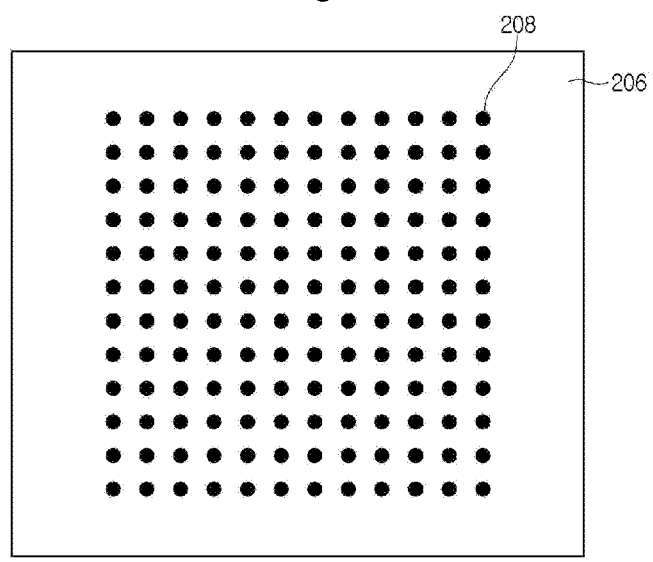
FIG. 5 is a planar view showing a transparent insulation layer with optical patterns according to a second embodiment of the present invention.

Subsequently, a transparent insulation layer with optical patterns according to a second embodiment of the present disclosure will be described in detail with reference to FIG. 5. FIG. 5 is a planar view showing a transparent insulation layer with an optical pattern according to the second embodiment of the present disclosure.

The transparent insulation layer according to the second embodiment of the present disclosure can include the same components as that of the previous embodiment. As such, the description of the second embodiment overlapping with the previous embodiment will be omitted. Also, the components of the second embodiment having the same as those of the previous embodiment will be referred to by the same reference numbers and names.

Referring to FIG. 5, a plurality of optical patterns 208 are arranged on a transparent insulation layer 206. The plurality of optical pattern 208 is arranged in a shape of plural regular trigons. The optical pattern 208 can become one of a concave (or a concave shape) and a protrusion (or protrusive shape).

The optical patterns 208 are arranged on regions of the transparent insulation layer 206 overlapping with red, green and blue color filter patterns. The interval (or distance) between the optical patterns 208 within a region overlapping with the red color filter pattern is longer than that between the optical patterns 208 within the other regions overlapping with the green and blue color filter patterns. Also, the interval (or distance) between the optical patterns 208 within a region overlapping with the blue color filter pattern is shorter than that of the optical patterns 208 within the other regions overlapping with the red and green color filter patterns.

In detail, the optical patterns 208 overlapping with the red color filter pattern can be arranged in an interval of about 270 nm~450 nm. The optical patterns 208 overlapping with the green color filter pattern can be arranged in another interval of about 240 nm~270 nm. The optical patterns 208 overlapping with the blue color filter pattern can be arranged in still another interval of about 220 nm~240 nm.

The transparent insulation layer 206 according to the second embodiment of the present disclosure includes the optical patterns 208 of the transparent insulation layer 206 to be arranged in the different intervals (or distances) from one another. In accordance therewith, the light output in the perpendicular direction can be easily performed within all sub-pixels.

Figure 6:
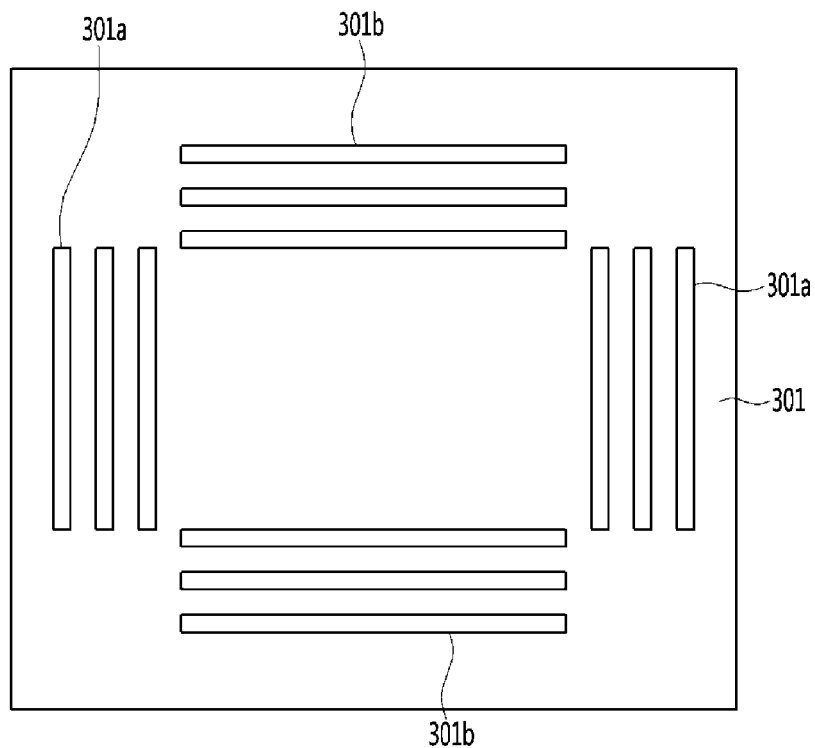
FIG. 6 is a planar view showing a mask according to the second embodiment of the present invention.

Next, a mask according to a second embodiment of the present disclosure used to form the optical patterns of the transparent insulation layer will be described in detail with reference to FIG. 6. FIG. 6 is a planar view showing a mask according to a second embodiment of the present disclosure.

The mask according to the second embodiment of the present disclosure can include the same components as that of the previous embodiment. As such, the description of the second embodiment overlapping with the previous embodiment will be omitted. Also, the components of the second embodiment having the same as those of the previous embodiment will be referred to by the same reference numbers and names.

Referring to FIG. 6, the mask 301 used to form optical patterns on the transparent insulation layer includes a plurality of slits. In detail, the mask 301 includes a plurality of first slits 301a each extending in a first direction and a plurality of second slits 300b each extending in a second direction. The first direction and the second direction can be perpendicular to each other.

The plurality of first slits 301a can be arranged parallel to one another in a perpendicular direction to the first direction (i.e., in the second direction). The plurality of second slits 301b can be arranged parallel to one another in a perpendicular direction to the second direction (i.e., in the second direction). In other words, the first slits 301a and the second slits 301b can be arranged in a shape of regular tetragon lattices.

The first slits 301a and the second slits 301b formed on the mask 301 are arranged in the shape of regular tetragon lattices. As such, it can be generated a periodic light interference effect. In accordance therewith, the optical patterns can be formed on the transparent insulation layer in such a manner that they are arranged in a shape forming plural regular tetragons.

The mask 301 according to the second embodiment of the present disclosure, which is used to form the optical patterns on the transparent insulation layer, allows the first slits 301a and the second slits 301b to be arranged in the shape of regular tetragon lattices. As such, the periodic light interference effect can be generated.

Figure 7:
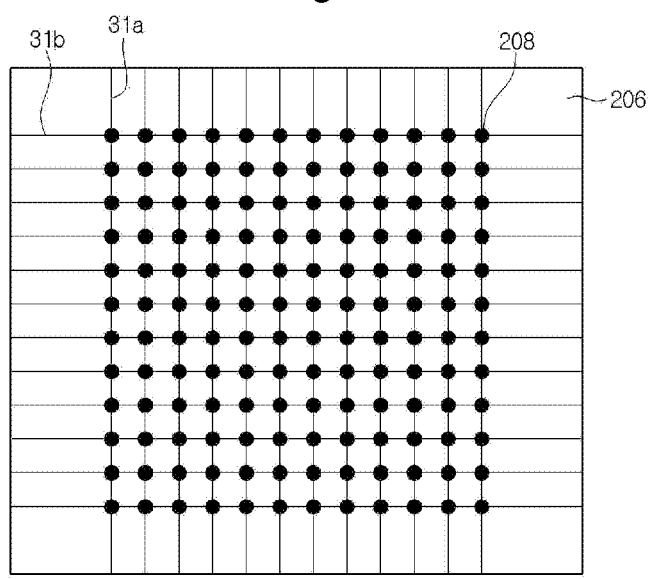
FIG. 7 is a planar view showing a method of forming optical patterns of a transparent insulation layer of an OLED display device according to the second embodiment of the present invention.

Finally, a method of forming optical patterns of a transparent insulation layer of an OLED display device according to a second embodiment of the present disclosure will be described in detail with reference to FIG. 7. FIG. 7 is a planar view showing a method of forming optical patterns of a transparent insulation layer of an OLED display device according to the second embodiment of the present disclosure.

Referring to FIG. 7, An OLED display device includes a transparent insulation layer 206 formed on a second substrate provided with a black matrix and a color filter layer. The black matrix with openings is prepared by forming a black resin layer on the second substrate and patterning the black resin layer through a photolithography procedure.

The color filter layer is formed in the openings corresponding to sub-pixel regions. The color filter layer includes red color filter patterns, green color filter patterns and blue color filter patterns.

A transparent insulation material layer is formed on the second substrate provided with the color filter layer. The transparent insulation material layer can be formed from a transparent photoreactive material.

A mask is disposed in such a manner as to face the second substrate 200 provided with the transparent insulation material layer. The mask includes a plurality of slits. In detail, the mask includes a plurality of first slits each extending along a first direction 31a and a plurality of second slits each extending along a second direction 31b.

The plurality of first slits can be arranged parallel to one another in a perpendicular direction to the first direction 31a. Also, the plurality of second slits can be arranged parallel to one another in a perpendicular direction to the second direction 31b. Moreover, the first slits and the second slits can be arranged in a shape of regular tetragon lattices.

Thereafter, light is irradiated onto the transparent insulation material layer through the mask having the plurality of slits. In accordance therewith, the transparent insulation layer 206 with a plurality of optical patterns 208 is formed.

The optical patterns 208 can be arranged in a shape of plural regular tetragons because the slits of the mask are arranged in the shape of regular tetragon lattices. Each of the optical patterns 208 can be formed at a position of the transparent insulation material layer opposite to an intersection of the first slit and second slit. This results from the fact that lights passing through the first and second slits and being collected into one reinforcement-interfere with each other on the transparent insulation material layer. Meanwhile, any optical pattern cannot be formed in the other regions of the transparent insulation material layer not opposite the intersection of the first slit and the second slits because lights passing through the first slit and the second slit offset-interfere with each other.

Also, the optical pattern 208 can become one of a concave (or a concave shape) and a protrusion (a protrusive shape). If the transparent insulation material layer is formed from a transparent positively-photoreactive material, the optical pattern 208 can be formed in a concave shape. On the contrary, when the transparent insulation material layer is formed from a transparent negatively-photoreactive material, the optical pattern 208 can be formed in a protrusion shape.

In this way, the transparent insulation layer with the optical patterns arranged in the shape of plural regular tetragons can be formed on the second substrate.

Such a formation method of the optical pattern of the transparent insulation layer of the OLED display device according to the second embodiment of the present disclosure uses the mask with the plurality of slits which are arranged in the shape of regular tetragon lattices. As such, the optical patterns 208 arranged in the shape of plural regular tetragons can be formed on the transparent insulation layer 206 without an additional etch process.

The above-mentioned features, structures, effects and so on of the present disclosure are included in at least one embodiment without being limited to only a single embodiment. Moreover, it is apparent to the ordinary skilled person in the art that various variations and modifications are possible to the features, structures, effects and so on which are disclosed by the embodiments. Therefore, it is interpreted that such variations and modifications are included in the scope of the present disclosure.

Also, although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. More particularly, various variations and modifications are possible in the component parts which are described in the embodiments. Accordingly, the scope of the present disclosure shall be determined only by the appended claims and their equivalents without being limited to the detailed description.

What is claimed is:

1. A method of fabricating an organic light emitting diode display device, the method comprising:
   forming a thin film transistor on a first substrate;
   forming an organic light emitting element, which is electrically connected to the thin film transistor, on the first substrate;
   forming a black matrix, in which openings are formed, on one surface of a second substrate opposite to the first substrate;
   forming a color filter layer in the openings;
   forming a transparent insulation layer having a first surface and a second surface opposing the first surface on the second substrate, with the first surface of the transparent insulating layer in direct contact with the color filter layer;
   forming a plurality of optical patterns at the second surface of the transparent insulation layer; and
   attaching the first substrate and the second substrate such that the second surface of the transparent insulating layer is closer to the thin film transistor than the first substrate.

2. The method of claim 1, wherein the forming of the transparent insulation layer includes:
   disposing a transparent insulation material layer on the second substrate provided with the color filter layer;
   disposing a mask with slits, which are arranged in a shape of regular polygon lattices, in opposition to the transparent insulation material layer; and
   irradiating light onto the transparent insulation material layer through the mask.

3. The method of claim 2, wherein the mask includes first slits, second slits and third slits which are arranged in a shape of regular trigon lattices.

4. The method of claim 2, wherein the mask includes first slits and second slits which are arranged in a shape of regular tetragon lattices.

5. The method of claim 2, wherein the plurality of optical patterns are formed in a periodic lattice shape at the second surface of the transparent insulation layer that is farther from the color filter layer and closer to the thin film transistor than the first surface.

6. The method of claim 2, wherein the plurality of optical patterns are one of a concave structure or a protrusion structure of the transparent insulation layer.

7. The method of claim 2, wherein:
- the color filter layer includes red, green and blue color filter patterns, and
- the optical patterns are arranged in an overlapping manner with the red, green and blue color filter patterns.

8. The method of claim 7, wherein an interval between the optical patterns overlapping with the red color filter pattern is different from an interval between the optical patterns overlapping with the green color filter pattern, and from an interval between the optical patterns overlapping with the blue color filter pattern.

9. The method of claim 8, wherein:
- the interval between the optical patterns overlapping the red color filter pattern is about 270 nm~450 nm,
- the interval between the optical patterns overlapping the green color filter pattern is about 240 nm~270 nm, and
- the interval between the optical patterns overlapping the blue color filter pattern is about 220 nm~240 nm.

* * * * *